United States Patent [19]

Morimoto et al.

[11] Patent Number: 4,500,742

[45] Date of Patent: Feb. 19, 1985

[54] IRON SILICIDE THERMOELECTRIC CONVERSION ELEMENT

[75] Inventors: Kiyoshi Morimoto, Mobara; Toshinori Takagi, Nagaokakyo, both of Japan

[73] Assignee: Futaba Denshi Kogyo K.K., Mobara, Japan

[21] Appl. No.: 574,145

[22] Filed: Jan. 26, 1984

[30] Foreign Application Priority Data

Feb. 9, 1983 [JP] Japan .................. 58-18848

[51] Int. Cl.³ ...................... H01L 35/00; H01L 37/00
[52] U.S. Cl. .................... 136/206; 148/176; 136/239; 357/67
[58] Field of Search .............. 136/206, 239; 148/176; 357/67

[56] References Cited

U.S. PATENT DOCUMENTS

| 3,880,674 | 4/1975 | Saunders | 136/238 X |
| 3,902,923 | 9/1975 | Evans et al. | 136/238 X |
| 4,063,964 | 12/1977 | Peressini et al. | 357/15 X |

*Primary Examiner*—Leland A. Sebastian
*Attorney, Agent, or Firm*—Oblon, Fisher, Spivak, McClelland & Maier

[57] ABSTRACT

An iron silicide thermoelectric conversion element wherein a part of one of components of the silicide is substituted by oxygen atom to form either Si-O bond or Fe-O bond in a matrix of the compound to provide either p-type conductivity or n-type conductivity as desired.

4 Claims, 9 Drawing Figures

IRON SILICIDE THERMOELECTRIC CONVERSION ELEMENT

BACKGROUND OF THE INVENTION

1. Field of the Invention

This invention relates to an iron silicide thermoelectric conversion element, and more particulaly to a thermoelectric conversion element wherein a part of one of components of iron silicide forming the element is substituted by oxygen atom to provide the element with p-type or n-type conductivity as desired.

2. Description of the Prior Art

Seebeck effect is widely known in the art as a phenomenon that when the joint between two kinds of materials joined to each other is heated, electric energy is generated at the ends of a lower temperature in the joined materials.

There have been conventionally found a lot of thermoelectric material which can exhibit such Seebeck effect. Unfortunately, the conventional materials are substantially inferior in conversion efficiency. Thus, the materials have not been put in practical use as an energy conversion element, for example, for converting solar heat energy into electric energy.

The inventors made an effort to develop a thermoelectric material of high conversion efficiency to effectively utilize solar energy or various types of waste heat energy, and found that an amorphous film of a compound mainly consisting of iron and silicon exhibits thermoelectric conversion efficiency sufficient to be used as a thermoelectric conversion element. However, the compound is not adapted to provide a thermoelectric conversion element of which conductivity is artificially controlled.

BRIEF SUMMARY OF THE INVENTION

The present invention has been made in view of the foregoing while taking notice of the fact that as a result of a further study on a thermoelectric material comprising a compound mainly consisting of iron and silicon, the conductivity of the element can be artificially controlled by substituting oxygen atom for a part of one of components of the compound.

Accordingly, it is an object of the present invention to provide an iron silicide thermoelectric conversion element which is capable of exhibiting either n-type conductivity or p-type conductivity as desired as well as exhibiting significantly high conversion efficiency.

It is another object of the present invention to provide an iron silicide thermoelectric conversion element which can be readily manufactured with a low cost.

In accordance with the present invention, there is provided an iron silicide thermoelectric conversion element mainly comprising a compound consisting of iron and silicon wherein a part of one of components of said compound forming said element is substituted by oxygen atom to provide said element with one of n-type conductivity and p-type conductivity.

BRIEF DESCRIPTION OF THE DRAWINGS

Other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENTS

Now, an iron silicide thermoelectric conversion element according to the present invention will be hereinafter described by way of example with reference to the accompanying drawings.

Various processes would be employed to prepare an iron silicide compound wherein a part of one of components of the compound is substituted by oxygen atom. The following description will be made on the preparation of a thin film of an iron silicide according to ionized cluster beam deposition method (hereinafter referred to as "ICB method").

Figure 1:
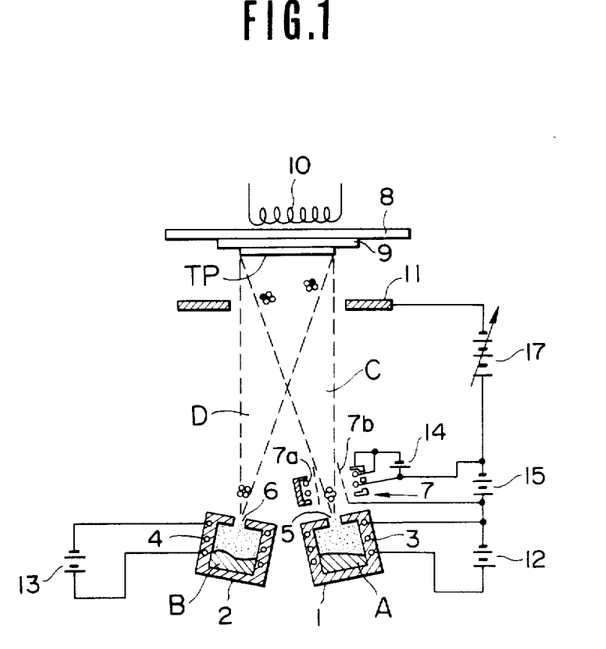
FIG. 1 is a schematic view showing an apparatus suitable for use in the preparation of an iron silicide thermoelectric conversion element according to the present invention.

FIG. 1 schematically shows one example of an apparatus adapted to practice the ICB method. The apparatus includes a pair of closed-type crucibles 1 and 2 which are adapted to receive therein components A and B forming iron silicide, respectively. The crucibles 1 and 2 have heating units 3 and 4 embedded in the walls thereof which serve to heat the crucibles 1 and 2 to vaporize the materials A and B, respectively. The crucibles 1 and 2 are respectively provided with injection nozzles 5 and 6 through which the components A and B heated and vaporized in the crucibles 1 and 2 are ejected into a low pressure atmosphere or a high vacuum region formed outside the crucibles. Upon injection from the crucibles, at least a part of each of the components is supercooled due to adiabatic expansion to allow 500–2000 atoms to be loosely bonded by a Van der Waals force to form an agglomerate of atoms called a cluster, and a vapor stream C containing such clusters in transported toward a substrate with kinetic energy imparted thereto at the time of injection from the crucibles in a manner as described hereinafter.

The apparatus also includes an ionization chamber 7 provided to surround a passage of the vapor stream C. The ionization chamber 7 comprises a filament or cathode 7a heated to emit electrons and an anode 7b of, for example, a lattice shape arranged to interpose or surround the vapor stream C at the inside of the filament 7a. The ionization chamber 7 of such construction is adapted to apply, to the anode 7a, a voltage positive with respect to the cathode 7a to allow electrons emitted from the cathode 7a to collide with the vapor stream C, to thereby ionize a part thereof. Such an ionization chamber may be provided with respect to the crucible 2 to ionize a part of a vapor stream D containing clusters ejected from the crucible 2.

The apparatus further includes a substrate holder 8 which serves to hold a substrate 9 thereon. The substrate 9 is adapted to be heated by means of a heating device 10 as required.

Reference numeral 11 designates an acceleration electrode which has an acceleration voltage negative with respect to the ionization chamber 7 applied thereto to accelerate ionized clusters and atoms toward the substrate 9.

Furthermore, the apparatus includes a power source system. More particularly, the power source system employed in the apparatus comprises power sources 12 and 13 for the heating units 3 and 4, a power source 14 for heating the filament 7a of the ionization chamber 7, a power source 15 for applying an ionization voltage between the filament 7a and the anode 7b, and a power source 17 for applying an acceleration voltage to the acceleration electrode 11.

The deposition apparatus constructed in the manner as described above to practice the ICB method is arranged in a vacuum casing (not shown) evacuated to a high vacuum except the power source system. The pressure in the vacuum casing or the pressure around the crucibles 1 and 2 is set at about $1/10^2$, preferably $1/10^4$ as much as vapor pressure within the crucibles 1 and 2.

The ICB method is capable of forming a film having good crystallographical properties, a high adhesion with respect to a substrate and a good surface flatness due to a surface migration effect which allows individual atoms of a formed cluster to diffuse on the surface of a substrate upon impinge on the substrate, an effect of ions contained in clusters or individual atoms on the formation or aggregation of nucleus in the initial stage of a film formation, a surface cleaning effect by kinetic energy of a vapor stream, an ion implantation effect and the like. Also, the ICB method has another advantage of depositing an excellent amorphous, polycrystalline or monocrystalline film in view of characteristics required, because it has a high degree of freedom with respect to the film forming conditions, such as, for example, the difference in pressure between the interior and exterior of a crucible, ionization in an ionization chamber and the degree thereof, an accelerating electric field, and the like, to thereby facilitate the control of a crystal structure.

The following description will be made with respect to an iron silicide thermoelectric conversion element prepared according to the ICB method described above.

First, a thermoelectric material of the p-conductivity type was prepared in the following manner. In FIG. 1, iron (Fe) of a high purity (about 99.9%) and silicon monoxide (SiO) were charged in the crucibles 1 and 2 and heated by the heating units 3 and 4 to be vaporized, respectively. The so-formed vapors of Fe and SiO were then ejected through the nozzles 5 and 6 into the high vacuum atmosphere so that at least a part of each of the vapors forms clusters and vapor streams C and D containing the so-formed clusters were transported toward the substrate with kinetic energy imparted thereto at the time of injection from the crucibles.

One example of the conditions set in the deposition of such material will be described hereinafter.

The vapor stream C of Fe which was ejected from the crucible 1 and of which at least a part formed clusters was ionized at an ionization current Ie of about 100 mA in the ionization chamber 7. The acceleration electrode 11 was not applied thereto an acceleration voltage ($Va=0$ V). Thus, the vapor stream C was transported toward the substrate 9 with only kinetic energy (corresponding to about 120 eV) corresponding to the injection velocity.

The vapor stream D containing clusters of $SiO_2$ ejected from the crucible 2 was not subjected to ionization. Thus, $SiO_2$ was transported in the form of neutral cluster, molecule and/or atom toward the substrate 9 with kinetic energy imparted thereto at the time of injection from the crucible 2. The substrate 9 was kept at a temperature Ts of about 200° C. The vacuum casing (not shown) in which the apparatus of FIG. 1 except the power source system is received was set at a pressure of $5 \times 10^{-5}$ Torr.

Under such conditions as described above, the vapor streams C and D were impinged on the surface of the substrate 9 and the reaction between the both components took place on the substrate 9 utilizing kinetic energy imparted thereto to promote the formation of a film having an excellent quality peculiar to the ICB method, to thereby form an iron silicide thermoelectric conversion element (hereinafter referred to as "thermoelectric element TP") on the surface of the substrate 9.

Now, thermoelectromotive force characteristics will be described which were measured on the so-formed thermoelectric element TP.

Figure 2:
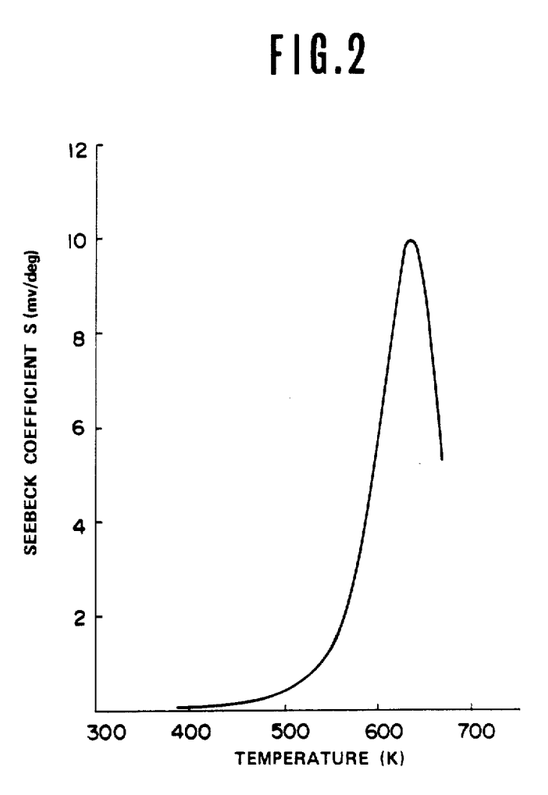
FIG. 2 is a graphical representation showing temperature characteristics of Seebeck coefficient of one embodiment of an iron silicide thermoelectric conversion element according to the present invention.

FIG. 2 shows thermoelectric power or temperature characteristics of Seebeck coefficient S obtained by measuring electromotive force generated between the both ends of the thermoelectric element TP when providing temperature difference therebetween. As is apparent from FIG. 2, the thermoelectric element TP forms a semi-conductor element of p-type conductivity, because it generates positive electromotive force on the low temperature side thereof when one end thereof is heated. This would be for the reason that an acceptor level due to Si—O bond was formed by practicing the ICB method wherein SiO instead of Si was charged in the crucible 2.

Also, as can be seen from FIG. 2, the thermoelectric element TP of the present invention generates huge thermoelectromotive force having Seebeck coefficient S of about 10 mV/deg at the temperature range between 600 K. and 650 K., wherein Seebeck coefficient S indicates thermoelectromotive force per unit temperature difference. In view of the foregoing, it will be noted that the thermoelectric element TP can effectively generate electromotive force of several volts when the temperature difference as described above is provided thereto. Thus, it is fully put in practical use as an energy conversion element which carries out effective utilization of solar energy or various kinds of waste heat energy.

Figure 3A:
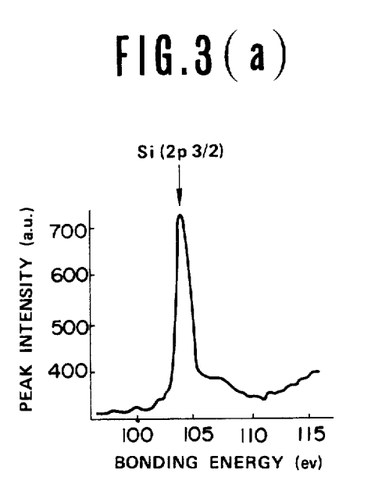
FIGS. 3A and 3B are graphical representation showing results of X-ray photoelectron spectroscopy on $FeSi_2$ which does not contain oxygen.
Figure 3B:
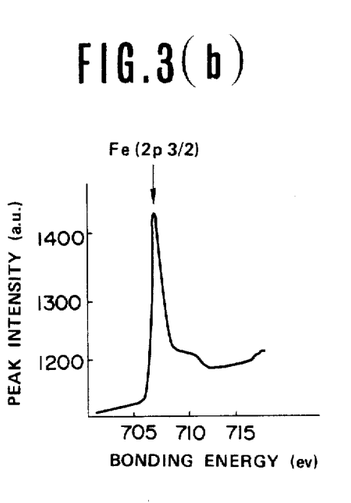
Figure 3C:
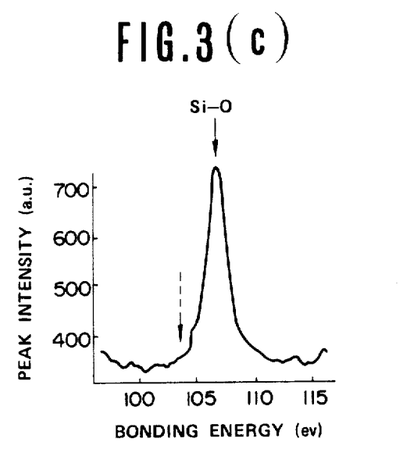
FIG. 3C is a graphical representation showing a result of X-ray photoelectron spectroscopy on an iron silicide thermoelectric conversion element according to the present invention.

The following description will be made with respect to X-ray photoelectron spectroscopy (hereinafter abbreviated to "XPS") carried out on the thermoelectric element TP prepared in the manner as described above. FIGS. 3A to 3C show results of the XPS. The XPS is to analyze energy of photoelectrons emitted from a solid material when X rays of a fixed energy are irradiated on the surface of the material to examine various energy levels of electrons in the material, to thereby grasp the bonding state of atoms in the material, the state of electrons in the material such as the binding energy of electrons and the distribution of electrons, and the like.

For comparison, the spectra of Si (2p 3/2) orbital and Fe (2p 3/2) orbital of FeSi$_2$ film which does not contain oxygen atom are first shown in FIGS. 3A and 3B, respectively.

The spectrum of the thermoelectric element TP according to the present invention is shown in FIG. 3C. In the thermoelectric element TP of the present invention obtained by depositing Fe and SiO$_2$, as indicated by an arrow of dotted lines in FIG. 3C, a peak completely disappears which corresponds to the Si (2p 3/2) orbital appearing in FIG. 3A. Substitutionally, a satellite peak is generated which corresponds to the Si—O bond, as shown in FIG. 3C. The Si—O bond would contribute to generate huge p-type thermoelectromotive force observed at the temperature range between 600 K. and 650 K. More particularly, the Si—O bond would form an acceptor level in the matrix of FeSi$_2$ to cause the thermoelectric element TP to have p-type conductivity. On the contrary, a peak which corresponds to Fe (2P 3/2) orbital of the thermoelectric element TP is entirely the same as that in FeSi$_2$ shown in FIG. 3B. Thus, the peak is omitted from FIG. 3C for clarity in the description.

Further, the temperature characteristics of electric conductivity $\sigma$ of the thermoelectric element TP were measured which are one of characteristics of the element. The results are shown in FIG. 4.

Figure 4:
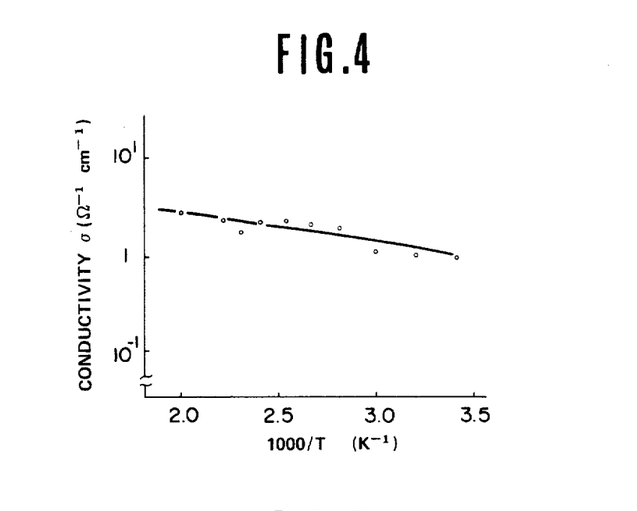
FIG. 4 is a graphical representation showing electric conductivity of an iron silicide thermoelectric conversion element according to the present invention.

In FIG. 4, the axis of abscissas indicates a temperature $[1000/T (K^{-1})]$ and the axis of ordinates indicates electric conductivity $\sigma$ of the thermoelectric element TP. As is apparent from FIG. 4, the thermoelectric element TP exhibits electric conductivity characteristics peculiar to a semi-conductor that the conductivity increases with the increase of a temperature. The electric conductivity $\sigma$ at the temperature range where the peak of Seebeck coefficient S appears is about $4\Omega^{-1}$ cm$^{-1}$, which is about four times as large as that of FeSi$_2$ film.

The performance of a thermoelectric material is typically evaluated using a performance index Z. The performance index Z is useful to evaluate the characteristics of a thermoelectric material. In general, the use of a thermoelectric material having a large performance index Z allows its conversion efficiency to be increased. The performance index Z is calculated by equation $Z=S^2\sigma/\kappa$, wherein S is Seebeck coefficient, $\sigma$ is electric conductivity and $\kappa$ is thermal conductivity.

The performance index Z of the thermoelectric element TP according to the present invention will be generally calculated, as follows:

The thermoelectric element TP of the present invention was about 10 mV/deg in Seebeck coefficient S and about $4\Omega^{-1}$ cm$^{-1}$ in electric conductivity $\sigma$ at a temperature of 650 K. Also, a measured value of the thermal conductivity $\kappa$ was about 0.01 W/°C.·cm. Thus, the performance index Z is calculated to be about $4\times10^{-1}$ deg$^{-1}$. This is about sixteen times as large as the performance index Z (about $2.5\times10^{-3}$ deg$^{-1}$) of FeSi$_2$ which does not contain oxygen or have Si—O bond formed therein. Also, the performance index Z of the thermoelectric element TP is larger by 1 or 2 in figure than those of various types of conventional thermoelectric materials such as Bi$_2$Te$_3$, PbTe and the like which have been put in practical use.

As can be seen from the foregoing, the thermoelectric element TP of the present invention has a high performance index at a relatively high temperature range, and thus, it will be noted that it exhibits high conversion efficiency.

Now, a thermoelectric element of n-type conductivity will be described which is the second embodiment of the present invention.

The thermoelectric element TP of p-type conductivity, as described above, is obtained by substituting oxygen for a part of Si contained in a matrix of iron silicide to form an acceptor level due to Si—O bond. On the contrary, the substitution of oxygen for a part of Fe contained in the matrix allows Fe—O bond to be produced therein to form a donor level, so that a thermoelectric element of n-type conductivity may be prepared.

The formation of Fe—O bond in the matrix of iron silicide to prepare such thermoelectric element would be made by various methods. The following description will be made on preparation of the element utilizing the ICB method.

In FIG. 1, the crucibles 1 and 2 are respectively charged with Fe and Si each having a relatively high purity (above 99.9%), and a small amount of oxygen is introduced into the high vacuum atmosphere through a gas supply pipe (not shown) opened in proximity to the nozzle 5 of the crucible 1 to allow the high vacuum region near the crucible 1 to have a pressure of about 1 to $5\times10^{-4}$ Torr. A part of the oxygen is then ionized in the ionization chamber 7 together with clusters of Fe. In order to promote the formation of Fe—O bond in a film to be deposited on the substrate 9, acceleration voltage Va of above 1-3 kV is applied to the acceleration electrode 11. A vapor stream of Si which is ejected from the crucible 2 to permit at least a part thereof to form clusters is not subjected to ionization. Thus, Si impinges on the surface of the substrate 9 in the form of a neutral cluster beam and in a manner to avoid the reaction with oxygen to the utmost so that a thermoelectric element TN of n-type conductivity may be formed.

The concentration of Fe—O bond in the iron silicide thermoelectric element can be controlled as desired by controlling ionization current Ie and acceleration voltage Va of the Fe side. In general, assuming that the substrate temperature Ts is constant, the concentration of Fe—O in the element tends to increase with the increase in ionization current Ie and acceleration voltage Va.

Figure 5:
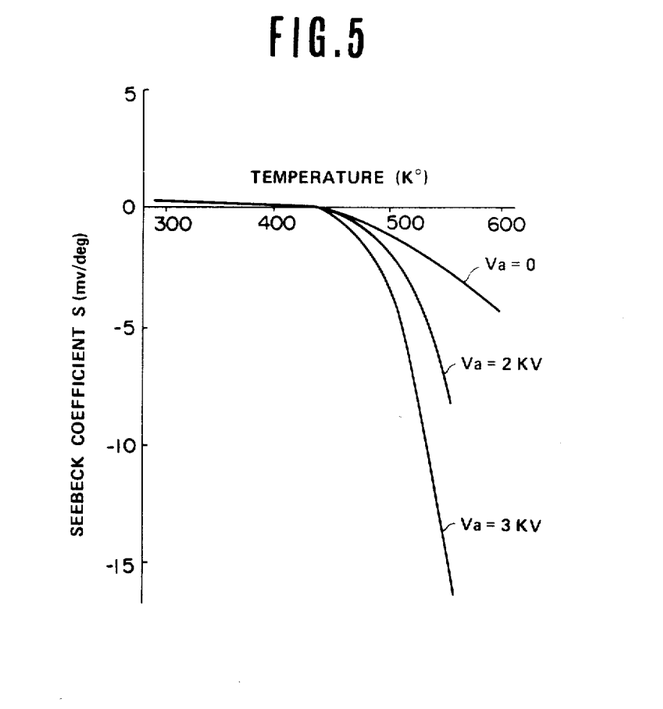
FIG. 5 is a graphical representation showing temperature characteristics of Seebeck coefficient of another embodiment of an iron silicide thermoelectric conversion element according to the present invention.

FIG. 5 shows the temperature characteristics of Seebeck coefficient of a thermoelectric element TN according to the present invention prepared under the conditions that the ionization current Ie and substrate temperature Ts are constantly kept at 200 mA and 200° C., respectively, and the acceleration voltage Va is alternately set at 0, 2 and 3 kV.

As can be seen from the results shown in FIG. 5, the thermoelectric element TN has small Seebeck coefficient of 40-100 $\mu$V at the temperature range between a room temperature and about 400 K. and exhibits p-type conductivity, and has at a temperature above 400 K. Seebeck coefficient sufficient to exhibit n-type conductivity which allows negative electromotive force to be generated on the lower temperature side of the element due to heating. The Seebeck coefficient sharply increases with the increase of temperature. In this instance, the larger the acceleration voltage Va is, the larger the value of Seebeck coefficient is, as shown in FIG. 5. This would be due to the increase of Fe—O bond in the matrix of the element. Also, it was experimentally proved that the increase in ionization current Ie causes the increase in Seebeck coefficient.

As described above, the formation of Fe—O bond in the matrix of iron silicide allows the thermoelectric element TN of n-type conductivity to be obtained. This would be for the reason that the Fe—O bond forms a donor level in the matrix. It will be noted that the thermoelectric element TN of n-type conductivity generates huge thermoelectromotive force essentially equivalent to that of the p-type conductivity thermoelectric element TP described above.

Thus, it will be understood that the thermoelectric element of either p-type conductivity or n-type conductivity according to the present invention may be obtained by substituting oxygen for a part of either one of components of iron silicide to form either Si—O bond or Fe—O bond in the matrix of the compound.

The above description has been made with respect to preparation of the thermoelectric elements TP and TN of p-type and n-type conductivities according to the ICB method, which is one example of methods suitable for use in the preparation of a thermoelectric element in the form of a film. It is a matter of course that the thermoelectric element of the present invention may be obtained in the form of a sintered body or a crystalline.

In the preparation of a thermoelectric element in the form of, for example, a sintered body, powdered Fe and SiO are fully mixed to make a mixture. Then, the mixture is sintered under a pressure of about 50 kg/cm$^2$ and at a temperature of about 1000°-1400° C. so that a thermoelectric element of p-type conductivity having a high performance index Z may be obtained in the form of a sintered body. Also, a thermoelectric element of n-type conductivity in the same form may be prepared by mixing powdered Si of a high purity and powdered iron oxide such as FeO, Fe$_3$O$_4$, Fe$_2$O$_3$ or the like to prepare a mixture and sintering the mixture under pressure.

Figure 6:
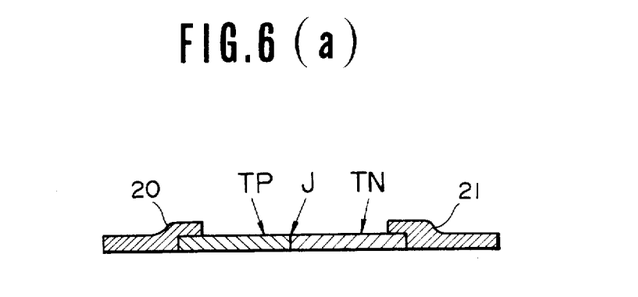
FIG. 6A is a schematic sectional view showing one example of applications of an iron silicide thermoelectric conversion element according to the present invention and FIG. 6B is a schematic perspective view partly in section showing another example of applications of an iron silicide thermoelectric conversion element according to the present invention.

The thermoelectric elements TP and TN are practical as an energy conversion element such as a thermobattery or the like. In this instance, it is advantageous that the energy conversion element is constructed using the both thermoelectric elements TP and TN rather than only one of the both to increase conversion efficiency. For example, the energy conversion element, as shown in FIG. 6A, may be constructed by joining together the thermoelectric element TP of p-type conductivity and the thermoelectric element TN of n-type conductivity at the opposite ends thereof. In the energy conversion element of such construction, the heating of the joint J at a high temperature allows positive holes to gather at the other end of the thermoelectric element TP to generate positive electromotive force and also allows electrons to gather at the other end of the thermoelectric element TN to generate negative electromotive force. Thus, when electrodes 20 and 21 each also acting as a radiator are respectively provided at the other ends of the elements TP and TN, thermoelectromotive force can be effectively taken out.

Alternatively, the energy conversion element may be constructed as shown in FIG. 6B. More particularly, it is formed in a manner to arrange the thermoelectric elements TP and TN into a doughnut shape on the upper and lower surfaces of a spacer or base plate 22 made of an electrical and thermal insulating material, respectively, and join the inner peripheral ends of the elements TP and TN to each other by means of a high temperature junction electrode 23. The outer peripheral ends of the elements TP and TN are provided with radiating fins 24 and 25 which are formed with output terminals 26 and 27, respectively.

In the energy conversion element shown in FIG. 6B, the high temperature junction electrode 23 is heated to form the difference in temperature between the inner and outer peripheries of each of the thermoelectric elements TP and TN, so that positive and negative electromotive forces may be taken out through the output terminals 26 and 27, respectively. Such electromotive force is sufficient to allow the element to be used as a thermobattery.

The energy conversion element shown in FIG. 6A or 6B can produce much larger thermoelectromotive force by carrying out cooling of the low temperature side thereof such as forced-air cooling of the radiators 20 and 21 or the radiating fins 24 and 25, the introduction of a cooling medium, or the like to render the difference in temperature between the high temperature side and the low temperature side larger. The p-n junction formed in such energy conversion element is not limited to such examples as shown in FIGS. 6A and 6B.

As described above, the thermoelectric conversion element of the present invention comprises iron silicide wherein a part of one of components thereof is substituted by oxygen atom to form either Si—O bond or Fe—O bond in the compound to control its conduction type as desired.

The thermoelectric conversion element according to the present invention constructed in the manner as described above, when being heated, can generate positive or negative electromotive force. Also, it has a performance index higher by 1 or 2 in figure than that of the conventional thermoelectric material, to thereby significantly improve a thermoelectric conversion efficiency. Thus, the thermoelectric element of the present invention can be put in practical use as a solar thermal electric conversion element a generating element capable of utilizing various types of waste heat, and the like as well as various sensors. In particular, the combination of the p-type and n-type thermoelectric elements according to the present invention can provide an energy conversion element of a high conversion efficiency.

Furthermore, the thermoelectric element of the present invention can be formed of Fe and Si each having a purity of 99.9% at most into a desired shape such as a film, a block or the like, to thereby allow the manufacturing cost to be significantly reduced.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. An iron silicide thermoelectric conversion element comprising a compound consisting of iron and silicon wherein a part of one of components of said compound forming said element is substituted by oxygen atom to provide said element with one of n-type conductivity and p-type conductivity.

2. An iron silicide thermoelectric conversion element mainly comprising a compound consisting of iron and silicon wherein a part of silicon contained in said compound is substituted by oxygen atom to provide said element with p-type conductivity.

3. An iron silicide thermoelectric conversion element mainly comprising a compound consisting of iron and silicon wherein a part of iron contained in said compound is substituted by oxygen atom to provide said element with n-type conductivity.

4. An iron silicide thermoelectric conversion element comprising a first element mainly comprising a first compound consisting of iron and silicon in which a part of silicon contained in said first compound is substituted by oxygen atom to provide said first element with p-type conductivity and a second element mainly comprising a second compound consisting of iron and silicon in which a part of iron contained in said second element is substituted by oxygen atom to provide said second element with n-type conductivity, said first and second elements being joined together.

* * * * *